United States Patent
Hsieh

(10) Patent No.: US 8,723,317 B2
(45) Date of Patent: May 13, 2014

(54) TRENCH METAL OXIDE SEMICONDUCTOR FIELD EFFECT TRANSISTOR WITH EMBEDDED SCHOTTKY RECTIFIER USING REDUCED MASKS PROCESS

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/616,384

(22) Filed: Sep. 14, 2012

(65) Prior Publication Data

US 2014/0077290 A1    Mar. 20, 2014

(51) Int. Cl.
*H01L 23/48*    (2006.01)
*H01L 23/34*    (2006.01)
*H01L 23/52*    (2006.01)
*H01L 21/00*    (2006.01)

(52) U.S. Cl.
USPC ............ 257/737; 257/707; 257/751; 438/118

(58) Field of Classification Search
USPC .................................. 257/330, 302, 332, 737
See application file for complete search history.

(56) References Cited

U.S. PATENT DOCUMENTS

| | | | |
|---|---|---|---|
| 5,917,216 A * | 6/1999 | Floyd et al. .................... | 257/330 |
| 7,285,822 B2 | 10/2007 | Bhalla | |
| 7,791,136 B1 * | 9/2010 | Hsieh ............................. | 257/330 |
| 7,816,720 B1 | 10/2010 | Hsieh | |
| 2006/0202264 A1 * | 9/2006 | Bhalla et al. .................. | 257/330 |
| 2006/0209887 A1 * | 9/2006 | Bhalla et al. .................. | 370/466 |
| 2008/0029812 A1 * | 2/2008 | Bhalla ............................ | 257/330 |
| 2009/0065855 A1 * | 3/2009 | Bhalla et al. .................. | 257/328 |
| 2010/0224932 A1 * | 9/2010 | Takaya et al. ................. | 257/330 |
| 2011/0278642 A1 * | 11/2011 | Tu .................................. | 257/130 |

* cited by examiner

*Primary Examiner* — Long K Tran
*Assistant Examiner* — Dzung Tran
(74) *Attorney, Agent, or Firm* — Bacon & Thomas, PLLC

(57) ABSTRACT

A trench MOSFET with embedded schottky rectifier having at least one anti-punch through implant region using reduced masks process is disclosed for avalanche capability enhancement and cost reduction. The source regions have a higher doping concentration and a greater junction depth along sidewalls of the trenched source-body contacts than along adjacent channel regions near the gate trenches.

11 Claims, 17 Drawing Sheets

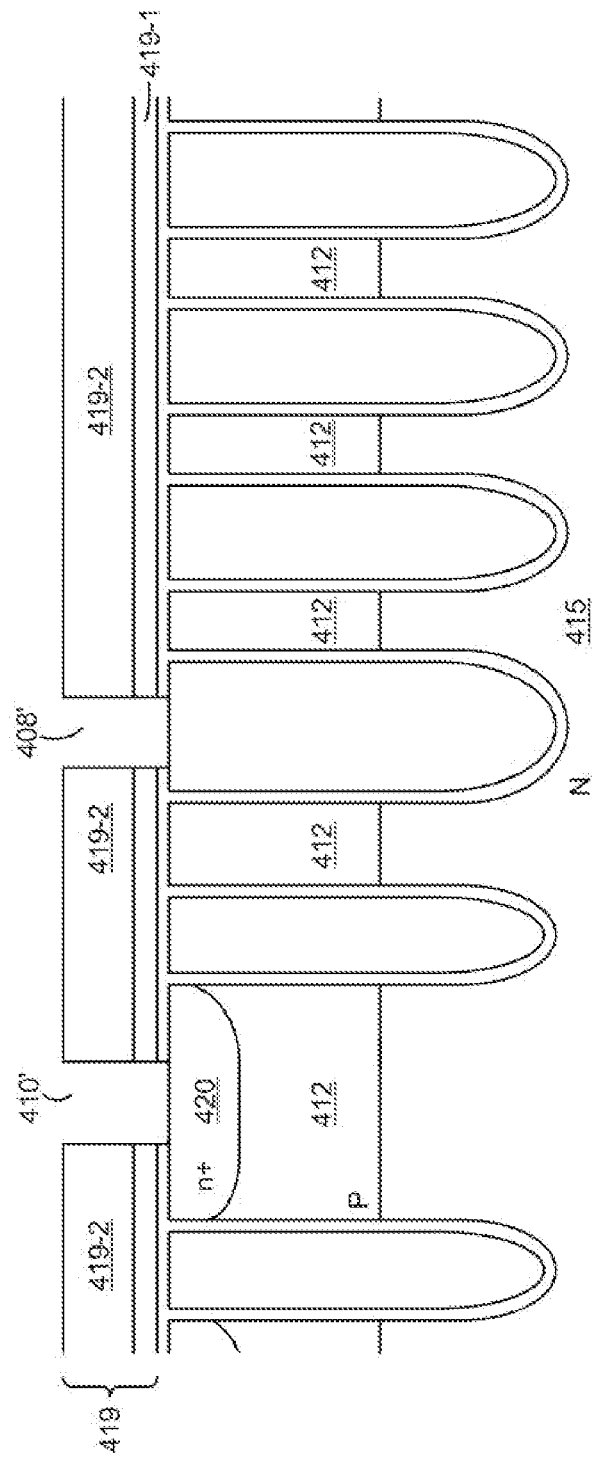

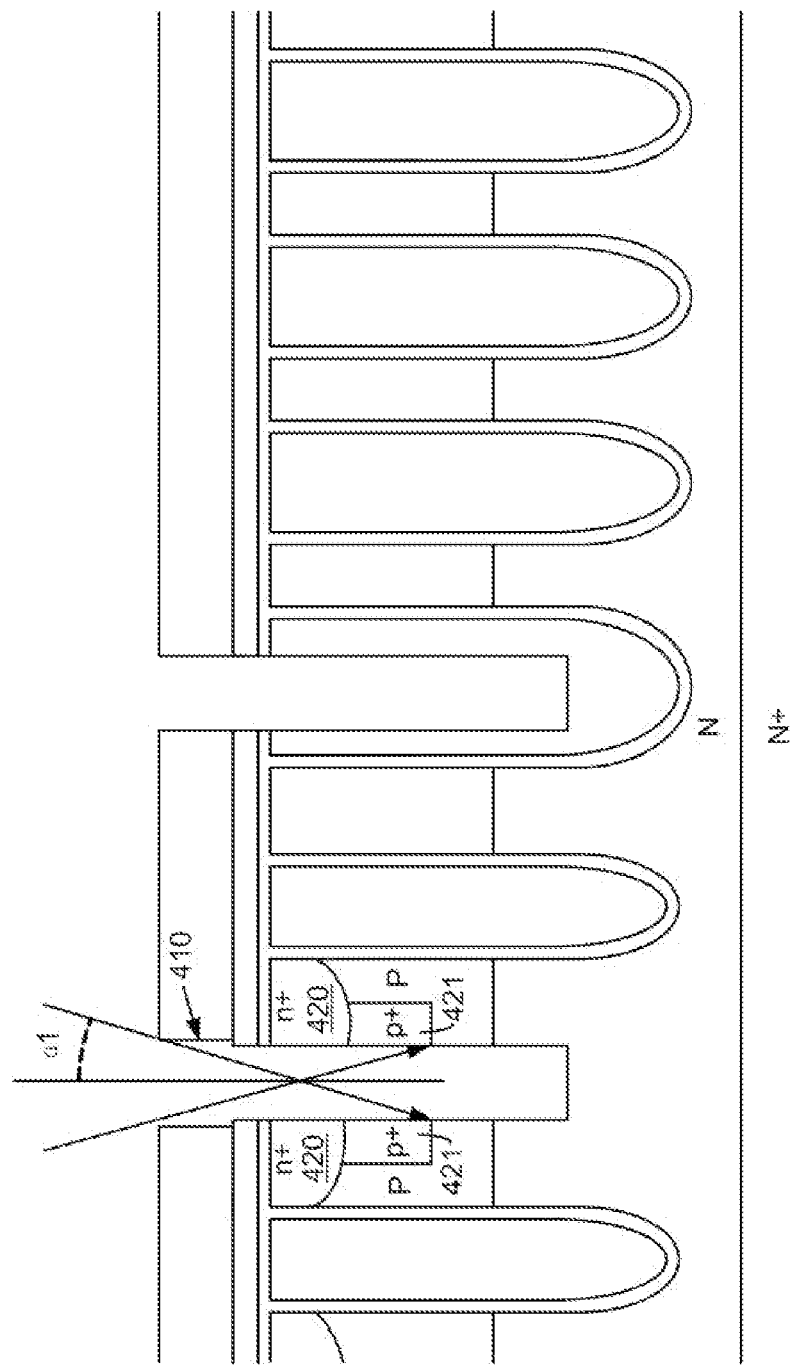

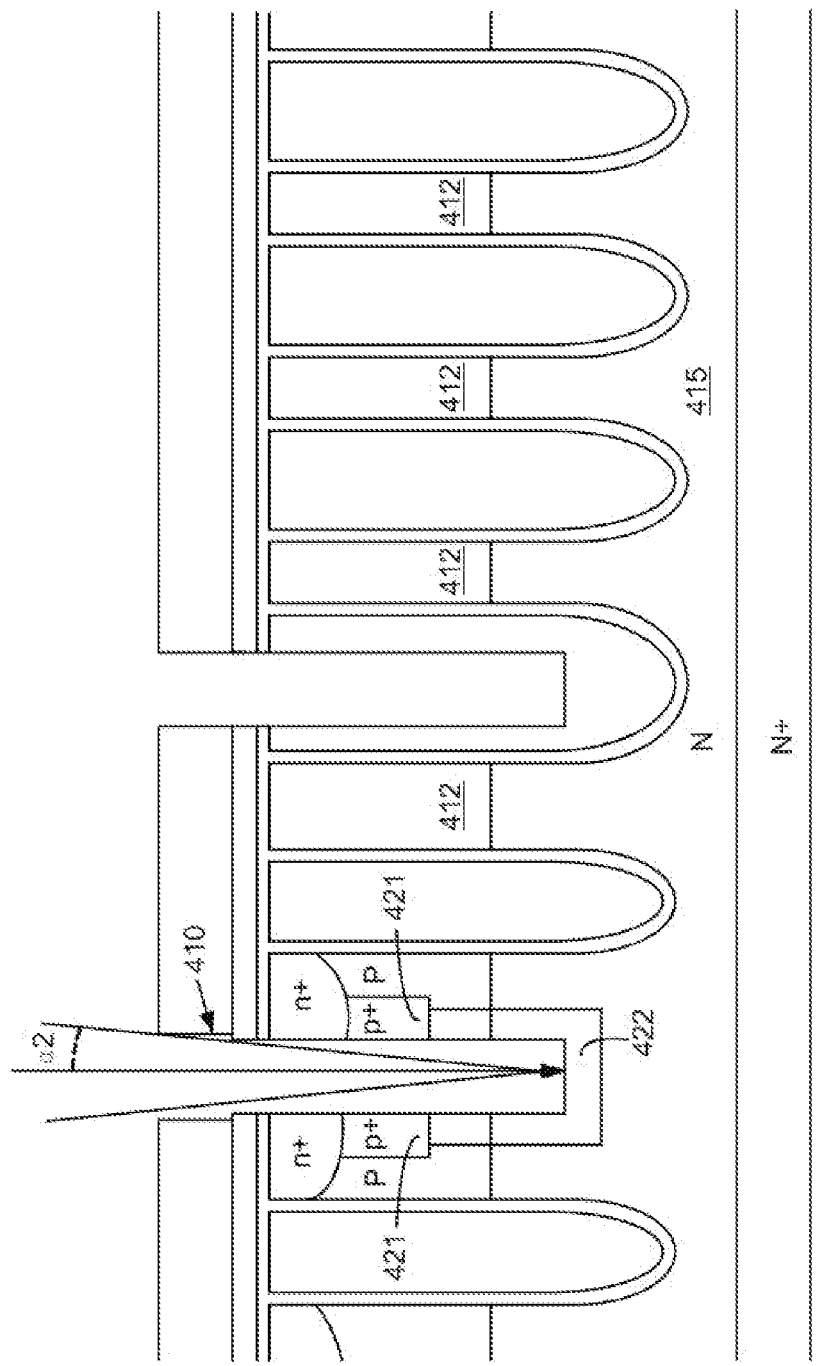

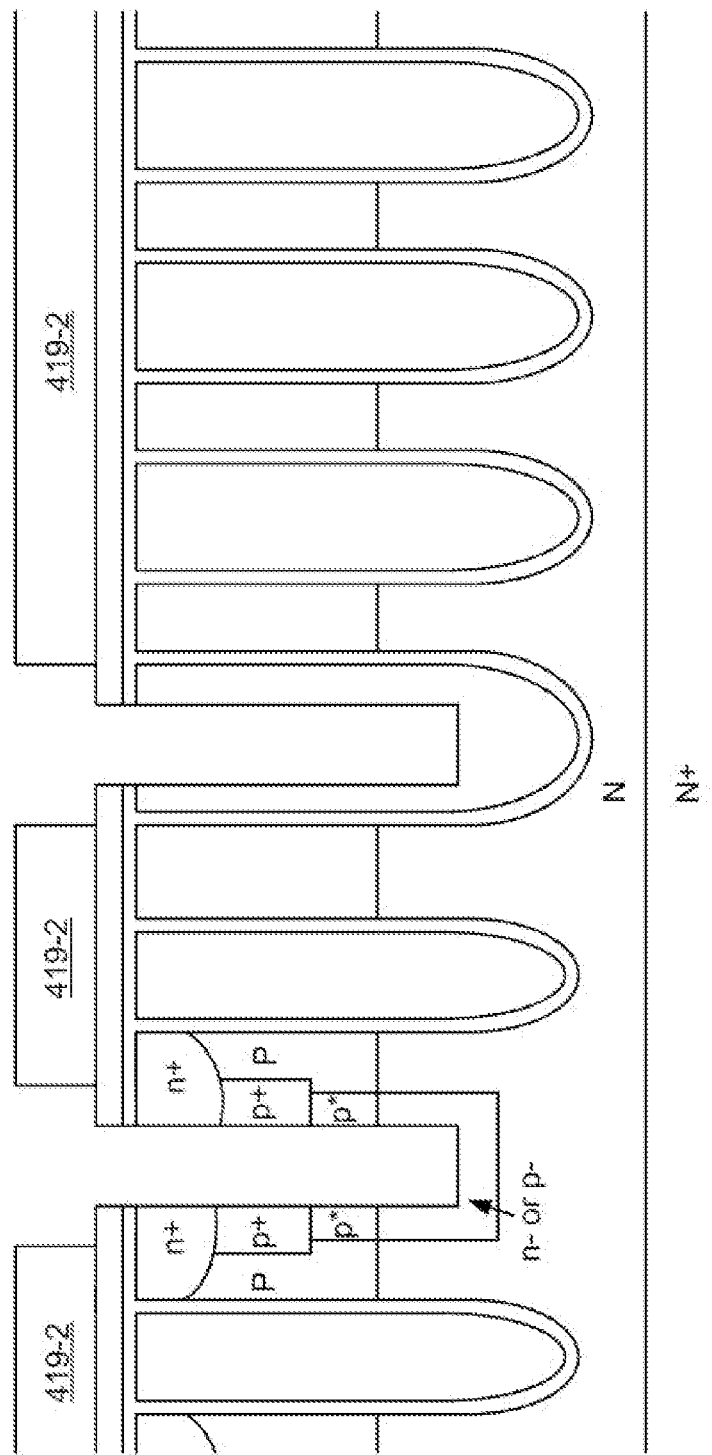

TRENCH METAL OXIDE SEMICONDUCTOR FIELD EFFECT TRANSISTOR WITH EMBEDDED SCHOTTKY RECTIFIER USING REDUCED MASKS PROCESS

FIELD OF THE INVENTION

This invention relates generally to the cell structure, device configuration and fabrication process of power semiconductor devices. More particularly, this invention relates to a novel and improved cell structure, device configuration and improved fabrication process of a trench metal oxide semiconductor field effect transistor (MOSFET, the same hereinafter) with embedded schottky rectifier using reduced masks process.

BACKGROUND OF THE INVENTION

Conventional technologies for manufacturing trench semiconductor power devices are continuously challenged to further reduce the manufacturing cost by reducing the number of masks applied in the manufacturing process. For example, for a trench MOSFET with embedded schottky rectifier, simplifying the manufacturing process and cutting down the manufacturing cost without degrading performance is mainly required by device designing and manufacturing.

Prior art U.S. Pat. No. 7,285,822 disclosed an N-channel trench MOSFET 100 with embedded schottky rectifier as shown in FIG. 1. A plurality of gate trenches 101 are extending into an N− epitaxial layer 102, and surrounded by a plurality of N+ source regions 103 encompassed in P body regions 104, wherein the N+ source regions 103 of the trench MOSFET 100 have a uniform doping concentration and junction depth between sidewalls of trenched source-body contacts 105 and adjacent channel regions near the gate trenches 101. First of all, this uniform distribution of doping concentration and junction depth of the N+ source regions 103 may lead to a hazardous failure during unclamped inductance switching (UIS, the same hereinafter) test at trench corners of the gate trenches 101 and may result in a poor avalanche capability especially for closed cell structure because a parasitic NPN bipolar transistor under the N+ source regions 103 is easily turned on (not shown), which has been disclosed in U.S. Pat. No. 7,816,720 having same inventor and assignee as this application. Second, the manufacturing process of the trench MOSFET 100 needs at least five masks for respectively forming: the gate trenches 101; the P body regions 104; the N+ source regions 103, the trenched source-body contacts 105; metal layers 107 and 107', which is complicate and cost ineffective.

Moreover, since only one anti-punch through implant region 106 is disposed along the sidewalls of the trenched source-body contacts 105, the bottoms and the sidewalls of the trenched source-body contacts 105 below the P body regions 104 are in contact with the N− epitaxial layer 102 to form schottky rectifiers. Furthermore, as illustrated in FIG. 1, the schottky rectifiers have a depth deeper than the adjacent gate trenches 101, which would lead to a high leakage current enhancement in the schottky rectifiers, because a pinch-off effect existing between the adjacent gate trenches 101 for the leakage current reduction becomes not pronounced.

Therefore, there is still a need in the art of the semiconductor power device, particularly for trench MOSFET with embedded schottky rectifier design and fabrication, to provide a novel cell structure, device configuration that would resolve these difficulties and design limitations without sacrificing other performances.

SUMMARY OF THE INVENTION

In one aspect, the present invention features a trench MOSFET with embedded Schottky rectifier using reduced masks (three or four masks) by saving body mask and source mask. That is because the source regions according to the present invention is formed by following a source diffusion after performing source ion implantation through contact openings defined by a contact mask for definition of trenched source-body contacts. Therefore, the source regions are self-aligned to the trenched source-body contacts, and have a higher doping concentration and a greater junction depth near sidewalls of the trenched source-body contacts than near adjacent channel regions at a same distance from a top surface of an epitaxial layer where the trench MOSFET is formed. Moreover, the lower doping concentration near the channel region added the difficulties for the parasitic bipolar transistor to be turned on, avoiding the UIS failure issue and improving the avalanche capability.

In another aspect, the present invention features a trench MOSFET with embedded Schottky rectifier having at least one anti-punch through implant region: a first anti-punch through implant region of a second conductivity doping type and formed along an upper portion of sidewalls of the trenched source-body contacts below the source regions, wherein the first anti-punch through implant region having a higher doping concentration than the body regions is for formation of body contact resistance reduction region to enhance UIS capability; in some preferred embodiments a second anti-punch through implant region having either the first or the second conductivity doping type underneath the first anti-punch through implant region, surrounding bottoms and a lower portion of the sidewalls of the trenched source-body contacts, for enhancement of the embedded Schottky rectifier barrier height to reduce Idsx current and enhance UIS current as well for both the trench MOSFET and the embedded Schottky rectifier.

Briefly, there is provided a trench MOSFET with embedded schottky rectifier, comprising: a substrate of a first conductivity type; an epitaxial layer of the first conductivity type onto the substrate, wherein the epitaxial layer has a lower doping concentration than the substrate; a plurality of gate trenches starting from a top surface of the epitaxial layer, extending downward into the epitaxial layer; a plurality of body regions of a second conductivity type formed in an upper portion of the epitaxial layer and between two adjacent the gate trenches; multiple trenched source-body contacts in an active area, each filled with a contact metal plug, penetrating through the body regions and extending into the epitaxial layer, wherein the trenched source-body contacts have a depth shallower than the gate trenches but deeper than the body regions; and a plurality of source regions of the first conductivity type formed near a top surface of the body regions and flanking the gate trenches in the active area, wherein the source regions have a higher doping concentration and a greater junction depth along sidewalls of the trenched source-body contacts than along adjacent channel regions near the gate trenches at a same distance from the top surface of the epitaxial layer; at least one anti-punch through implant region surrounding at least a portion of sidewalls of the trenched source-body contacts.

According to yet another aspect of the present invention, each of the gate trenches is filled with a conductive material padded by a gate oxide layer, wherein the conductive material has a top surface not higher than a top surface of the source regions.

According to yet another aspect of the present invention, each of the gate trenches is filled with a conductive material padded by a gate oxide layer, wherein the conductive material has a top surface higher than the top surface of the source regions to form terrace gate structure.

According to yet another aspect of the present invention, the gate oxide layer has oxide thickness along bottom equal to or thinner than along sidewalls of the gate trenches.

According to yet another aspect of the present invention, the gate oxide layer has greater thickness along bottoms than along sidewalls of the gate trenches.

According to yet another aspect, the present invention further comprises a doped island of the second conductivity type formed below the trenched source-body contacts and between every two adjacent gate trenches in the epitaxial layer to reduce Idsx by decreasing electric field near the embedded Schottky rectifier.

According to yet another aspect, the present invention further comprises at least one gate contact trench used for gate connection to a gate metal via a trenched gate contact. More preferred, the trenched gate contact has a depth shallower than the trenched source-body contacts to avoid gate-drain shortage through trenched gate contact.

The present invention further discloses a method for manufacturing a trench MOSFET with embedded schottky rectifier, comprising: forming a plurality of gate trenches in an epitaxial layer of a first conductivity type by applying a trench mask; depositing conductive material padded by a gate oxide layer to fill the gate trenches; forming a plurality of body regions in an upper portion of the epitaxial layer by performing body ion implantation of a second conductivity type; depositing a contact interlayer over a top surface of the conductive material and the body regions; forming a plurality of contact openings in the contact interlayer by applying a contact mask; forming a plurality of source regions of the first conductivity type near the top surface of the body regions by performing source ion implantation through the contact openings and performing source diffusion without requiring a source mask; further etching the contact openings to form trenched source-body contacts through the source regions and the body regions into the epitaxial layer, wherein the trenched source-body contacts have a depth shallower than the gate trenches. When forming some preferred embodiments having terrace gate structure, the conductive material is remained having a top surface higher than the epitaxial layer; otherwise, the conductive material is etched to remain necessary portion within the gate trenches and have a top surface not higher than the epitaxial layer. When forming some preferred embodiments having body regions in all other areas, a body mask is no longer required in body ion implantation step. When forming some preferred embodiments having a first anti-punch through implant region, the steps further comprises: carrying out a first angle ion implantation with a dopant of the second conductivity type having a angle $\alpha 1$ respective to a vertical line through the contact openings to form the first anti-punch through implant region along an upper portion of sidewalls of the trenched source-body contacts below the source regions. When forming some preferred embodiments having a second anti-punch through implant region, the steps further comprises: after formation of the first anti-punch through implantation region, carrying out a second angle ion implantation with a dopant of the second conductivity type having a angle $\alpha 2$ respective to the vertical line through the contact openings to form the second anti-punch through implant region surrounding bottoms and a lower sidewalls of the trenched source-body contacts below the first anti-punch through implant region, wherein the dopant dose in the second angle ion implantation is less than the dopant dose in the first angle ion implantation, and the angle $\alpha 2$ is less than the angle $\alpha 1$ respective to the vertical line.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 10A to 10H are a serial of side cross-sectional views for showing the process steps for manufacturing a semiconductor power device as shown in FIG. 4.

DETAILED DESCRIPTION OF THE EMBODIMENTS

In the following Detailed Description, reference is made to the accompanying drawings, .which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
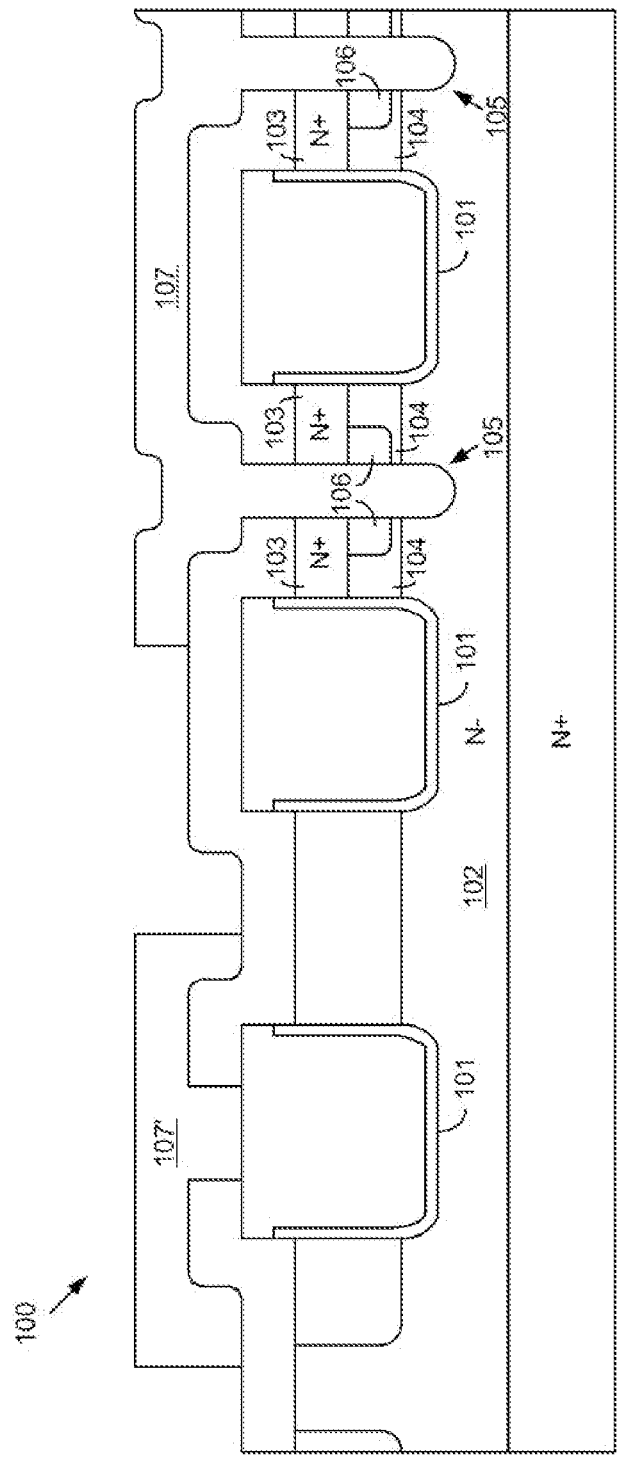
FIG. 1 is a cross-sectional view of a trench MOSFET with embedded schottky rectifier of prior art.
Figure 2:
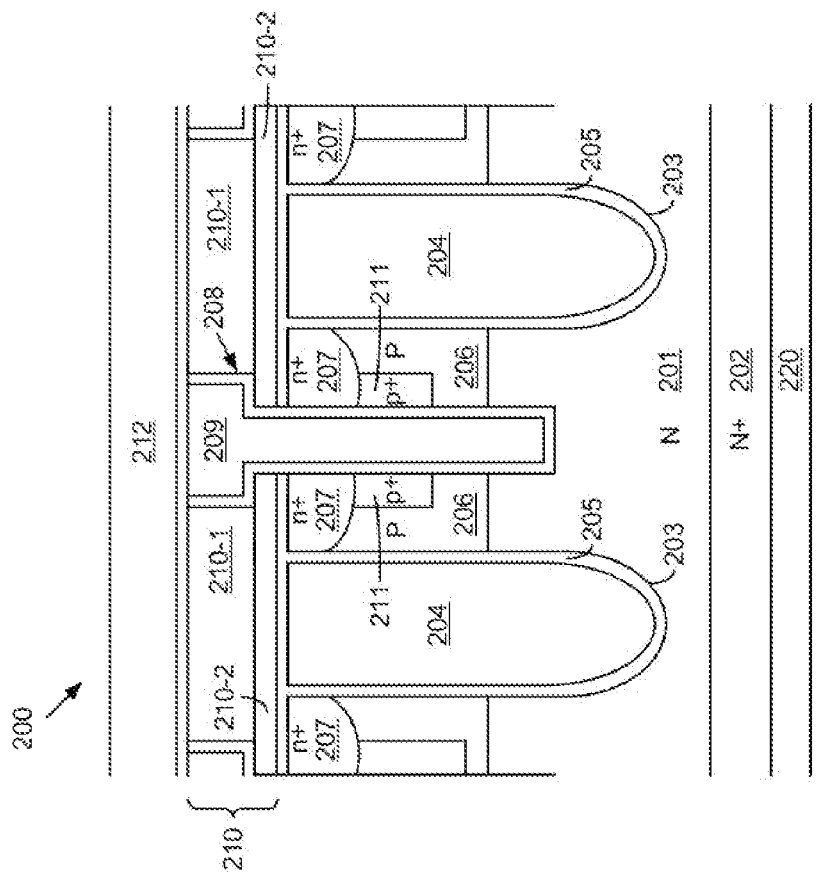
FIG. 2 is a cross-sectional view of a preferred embodiment according to the present invention.

Please refer to FIG. 2 for a preferred embodiment of this invention wherein an N-channel trench MOSFET 200 with embedded schottky rectifier is formed in an N epitaxial layer 201 onto an N+ substrate 202 coated with a back metal of Ti/Ni/Ag on rear side as a drain metal 220. A plurality of gate trenches 203 are formed starting from a top surface of the N epitaxial layer 201 and extending downward into the N epitaxial layer 201. Each of the gate trenches 203 is filled with a conductive material 204, for example a doped poly-silicon, padded by a gate oxide layer 205, wherein the gate oxide layer 205 has substantially uniform thickness along sidewalls and bottom of each of the gate trenches 203. Alternatively, the gate oxide layer 205 has oxide thickness along bottom thinner than along sidewalls of the gate trenches. A plurality of P body regions 206 are formed in an upper portion of the N epitaxial layer 201 and extending between two adjacent gate trenches 203. A plurality of n+ source regions 207 are formed near a top surface of the P body regions 206 in an active area. A plurality of trenched source-body contacts 208 each filled with a contact metal plug 209 are penetrating through a contact interlayer 210, the n+ source regions 207, the P body regions 206 in the active area and extending into the N epitaxial layer 201, wherein the trenched source-body contacts 208 have a depth shallower than the gate trenches 203 but deeper than the P body regions 206. As the lower portion of the trenched source-body contacts 208 and the interfaced N epitaxial layer 201 together form the embedded schottky rectifiers, the embedded Schottky rectifiers formed below the P body regions 206 along trench sidewalls and bottom of lower portion of trenched source-body contacts have a depth shallower than the adjacent gate trenches 203, thus avoiding the high leakage current and enhancing pinch-off effect compared to the prior art. According to this embodiment, the contact metal plug 209 can be implemented by a tungsten metal layer padded by a barrier metal layer of Ti/TiN or Co/TiN or Ta/TiN; the contact interlayer 210 can be implemented by being composed of a Phosphorus Silicate Glass (PSG, the same hereinafter) or Boron Phosphorus Silicate Glass (BPSG, the same hereinafter) layer 210-1 and an undoped oxide layer 210-2; and the trenched source-body contacts 208 connect the n+ source regions 207 and the P body regions 206 to a source metal 212 comprising Al alloys or Cu padded by a resistance-reduction layer of Ti or TiN. A first p+ anti-punch through implant region 211 is formed along a higher portion of sidewalls of the trenched source-body contacts 208 and below the n+ source regions 207 to achieve pronounced anti-punch through effects and also to reduce body contact resistance, wherein the first p+ anti-punch through implant region 211 has a higher doping concentration than the P body regions 206. According to the present invention, the n+ source regions 207 are formed by self-aligned to contact mask and source diffusion without requiring a source mask, therefore having a higher doping concentration and a greater junction depth along the sidewalls of the trenched source-body contacts 208 than along adjacent channel regions near the gate trenches 203 at a same distance from the top surface of the N epitaxial layer 201. More detailed, the n+ source regions 207 have a doping profile of Gaussian-distribution along the top surface of the epitaxial layer 201 from the sidewalls of the trenched source-body contacts 208 to the adjacent channel regions near the gate trenches 203, leading to better avalanche capability performance and lower cost compared to the prior art.

Figure 3:
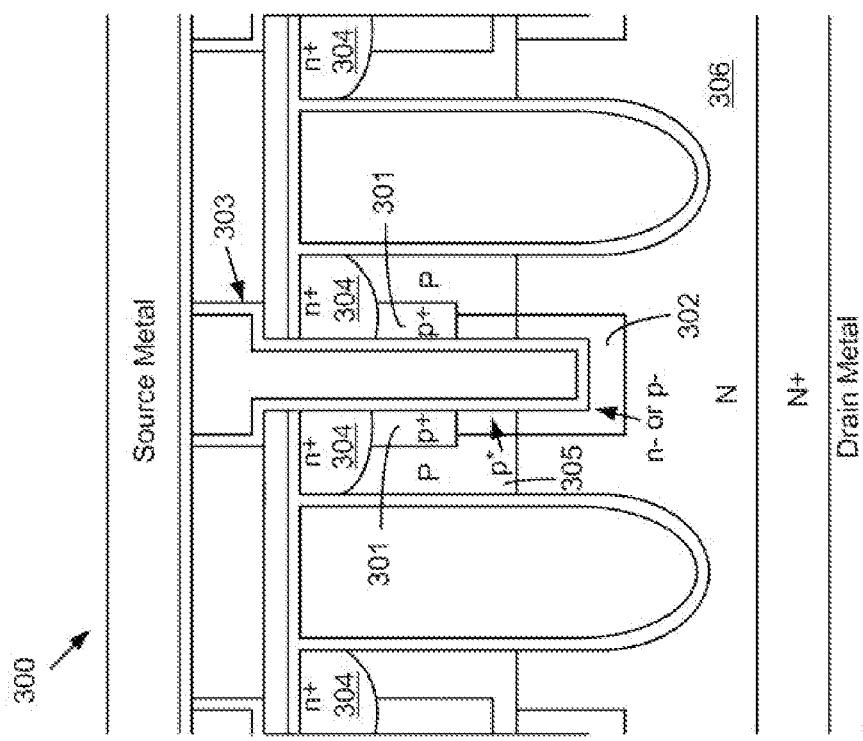
FIG. 3 is a cross-sectional view of another preferred embodiment according to the present invention.

FIG. 3 shows a cross-sectional view of another trench MOSFET 300 with embedded schottky rectifier according to the present invention. The N-channel trench MOSFET 300 has a similar structure to the trench MOSFET 200 in FIG. 2 except that, the trench MOSFET 300 has double anti-punch through implant regions: the first p+ anti-punch through implant region 301 formed along an upper portion of sidewalls of the trenched source-body contacts 303 and below the n+ source regions 304 in the P body regions 305, to achieve pronounced anti-punch through effects and also to reduce body contact resistance; a second anti-punch through implant region 302 surrounding bottom and a lower portion of the sidewalls of each of the trenched source-body contacts 303 underneath the first anti-punch through implant region 301. What should be noticed is that, the part of the second anti-punch through implant region 302 located in the P body regions 305 is P type (p* as illustrated in FIG. 3) and having a higher doping concentration than the P body regions 305; the other part of the second anti-punch through implant region 302 underneath the P body regions 305 has either n− or p− doping type (n− or p−, as illustrated in FIG. 3) depending on the second anti-punch through implant dose.

Figure 4:
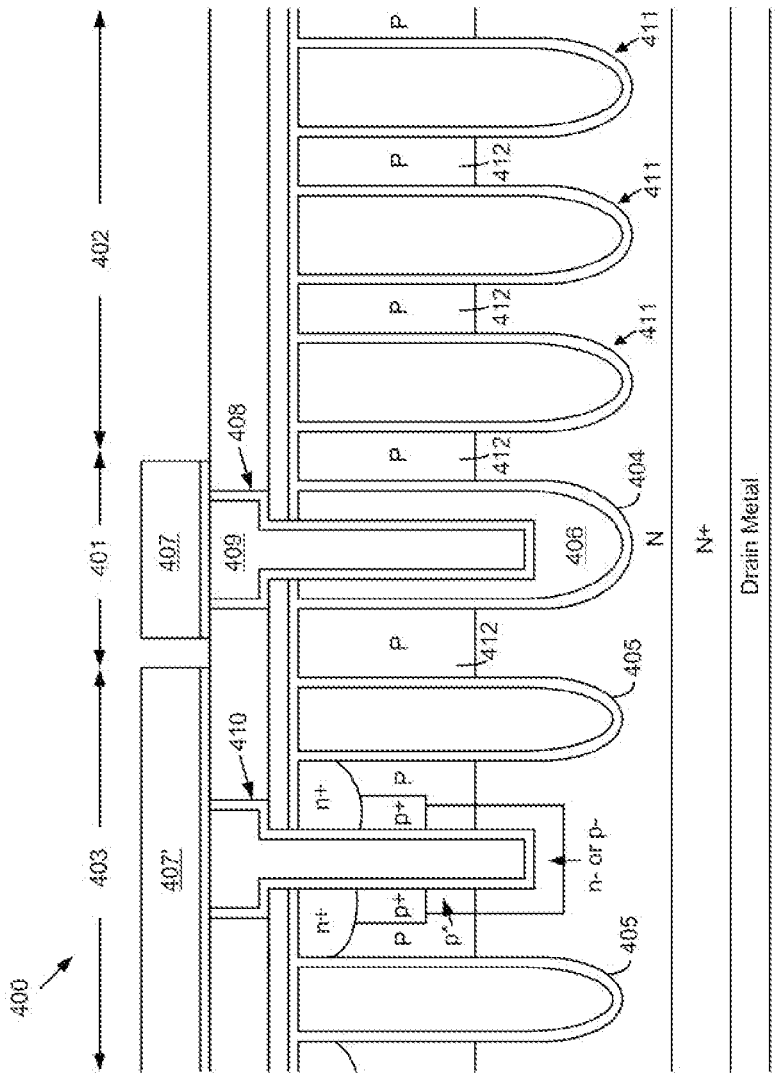
FIG. 4 is a cross-sectional view of another preferred embodiment according to the present invention.

FIG. 4 shows a cross-sectional view of another trench MOSFET 400 according to the present invention. The N-channel trench MOSFET 400 has a similar structure to the trench MOSFET 300 in FIG. 3 except that, the trench MOSFET 400 further comprises a trenched gate contact area 401 and a termination area 402 besides the active area 403. The trenched gate contact area 401 comprises at least one wide gate trench 404 having a same filling-in structure as the gate trenches 405 in the active area 403 except for having a greater trench width. The conductive material 406 filled in the wide gate trench 404 is connected to a gate metal 407 of the trench MOSFET 400 for gate connection via a trenched gate contact 408 filled with the contact metal plug 409, wherein the trenched gate contact 408 in the trenched gate contact area 401 and trenched source-body contacts 410 in the active area 403 are simultaneously formed by the same contact mask and in the same etching step in manufacturing process. The contact metal plug 409 can be implemented by a tungsten metal layer padded by a barrier metal layer of Ti/TiN or Co/TiN or Ta/TiN. The gate metal 407 comprises Al alloys or Cu padded by a resistance-reduction layer of Ti or TiN. The termination area 402 comprises multiple trenched floating gates 411 being spaced apart by the P body regions 412, wherein the multiple trenched floating gates 411 have a same filling-in structure as in the gate trenches 405 in the active area 403 except for having floating voltage for maintaining high breakdown voltage in the termination area 402. Therefore, the manufacturing process of the trench MOSFET 400 only needs three masks respectively for: the gate trenches 405 and the trenched floating gates 411; the trenched gate contact 408 and the trenched source-body contacts 410; the gate metal 407 and the source metal 407', the number of masks is reduced compared with the prior art to further cut down the manufacturing cost.

Figure 5:
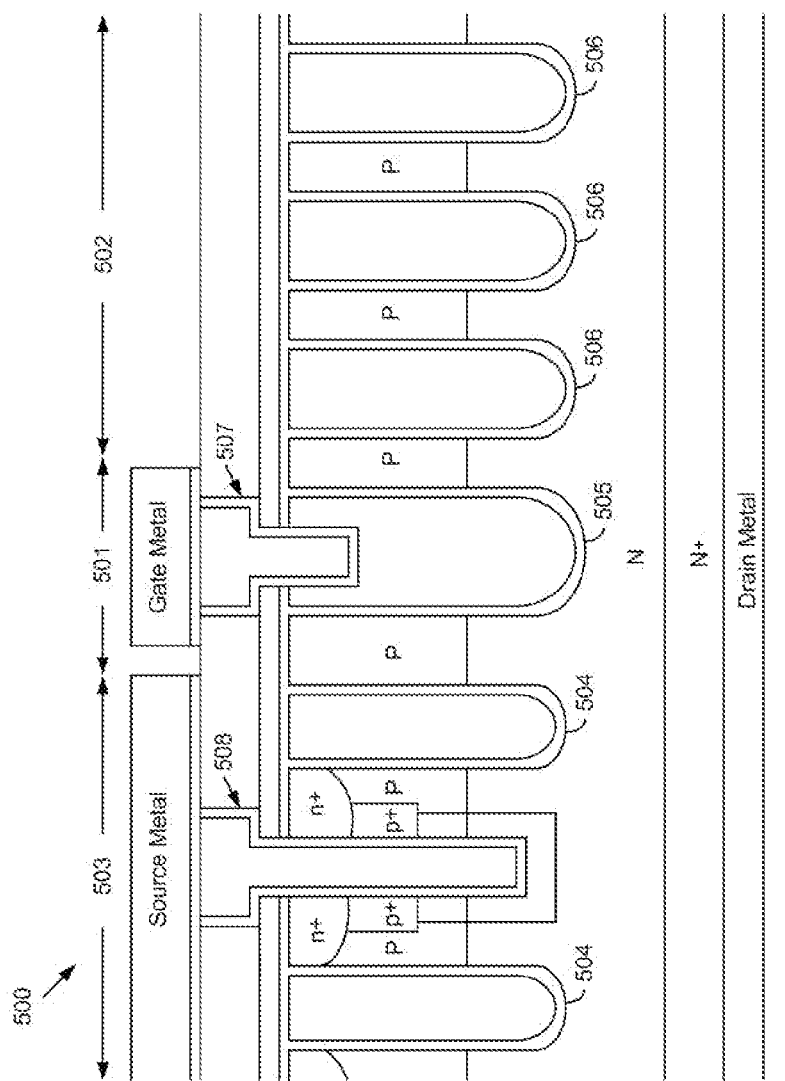
FIG. 5 is a cross-sectional view of another preferred embodiment according to the present invention.

FIG. 5 shows a cross-sectional view of another trench MOSFET 500 according to the present invention. The N-channel trench MOSFET 500 has a similar structure to the trench MOSFET 400 in FIG. 4 except that, in FIG. 5, the trenched gate contact 507 extending into the wide gate trench 505 is defined and manufactured by a different contact mask and in a different etching step from the trenched source-body contacts 508, making the trenched gate contact 507 shallower than the trenched source-body contacts 508 to prevent gate/drain shortage. Therefore, when forming the trench MOSFET 500, four masks are required compared to FIG. 4 because an additional contact mask is needed for making the trenched gate contact 507.

Figure 6:
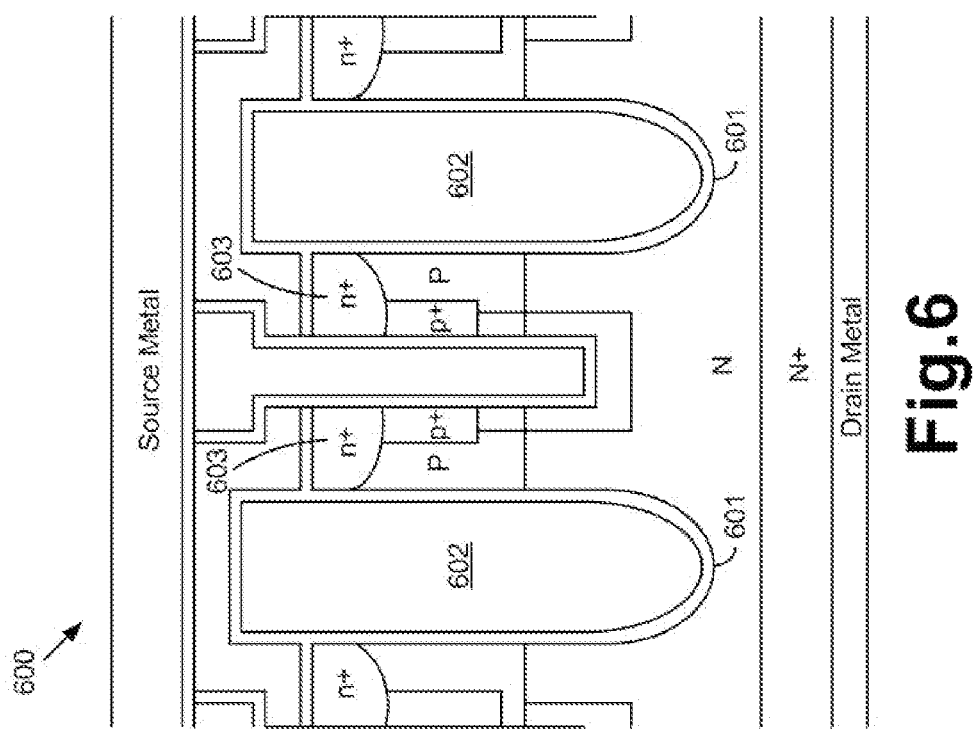
FIG. 6 is a cross-sectional view of another preferred embodiment according to the present invention.

FIG. 6 shows a cross-sectional view of another trench MOSFET 600 according to the present invention. The N-channel trench MOSFET 600 has a similar structure to the trench MOSFET 300 in FIG. 3 except for having terrace gate structure, which means the conductive material 602 filled in the gate trench 601 has s top surface higher than the n+ source regions 603.

Figure 7:
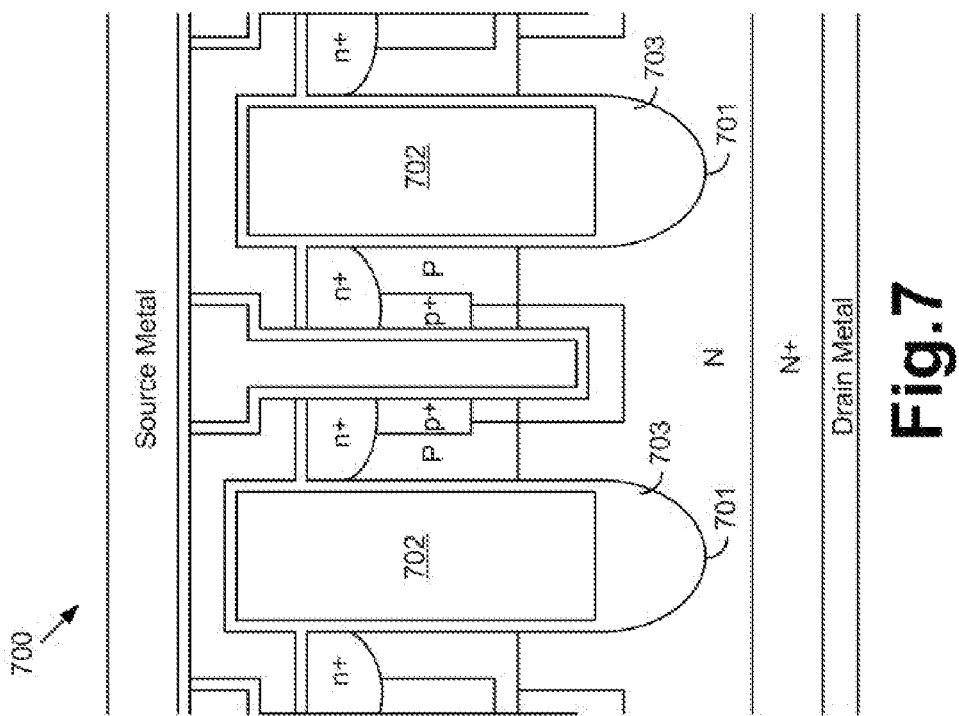
FIG. 7 is a cross-sectional view of another preferred embodiment according to the present invention.

FIG. 7 shows a cross-sectional view of another trench MOSFET 700 according to the present invention. The N-channel trench MOSFET 700 has a similar structure to the trench MOSFET 600 in FIG. 6 except that, the gate oxide layer 703 padded the conductive material 702 has greater thickness along bottom than along sidewalls of each of the gate trenches 701 to achieve a lower Qgd.

Figure 8:
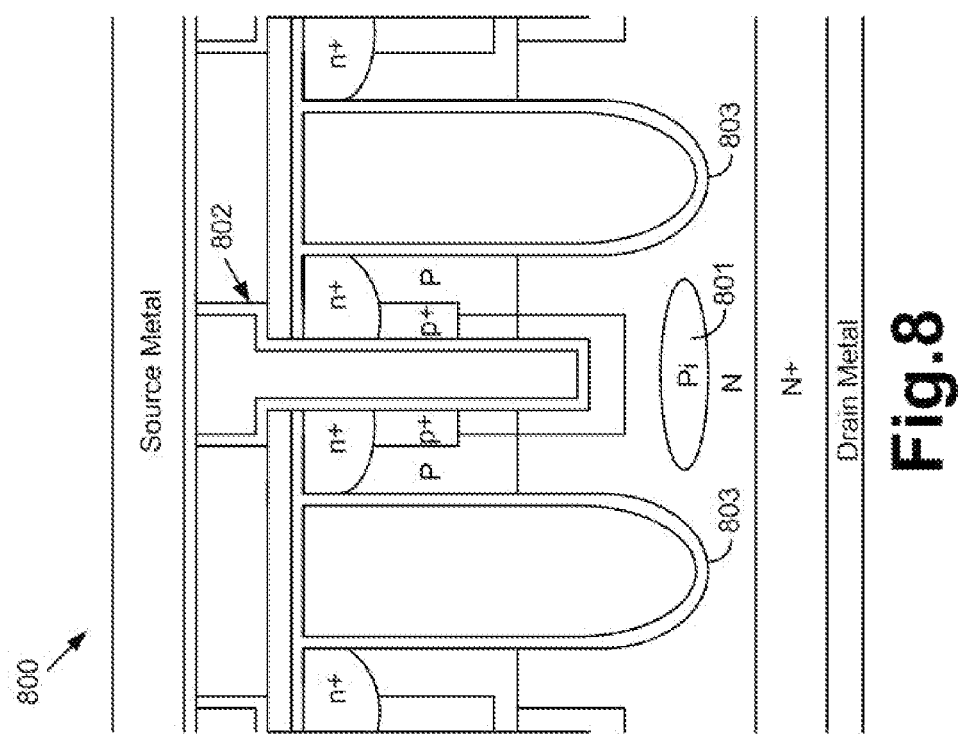
FIG. 8 is a cross-sectional view of another preferred embodiment according to the present invention.

FIG. 8 shows a cross-sectional view of another trench MOSFET 800 according to the present invention. The N-channel trench MOSFET 800 has a similar structure to the trench MOSFET 300 in FIG. 3 except that, the trench MOSFET 800 further comprises at least a P island (Pi, as illustrated in FIG. 8) 801 below each of the trenched source-body contacts 802 and between every two adjacent gate trenches 803 to reduce Idsx by decreasing electric field near schottky rectifier area.

Figure 9:
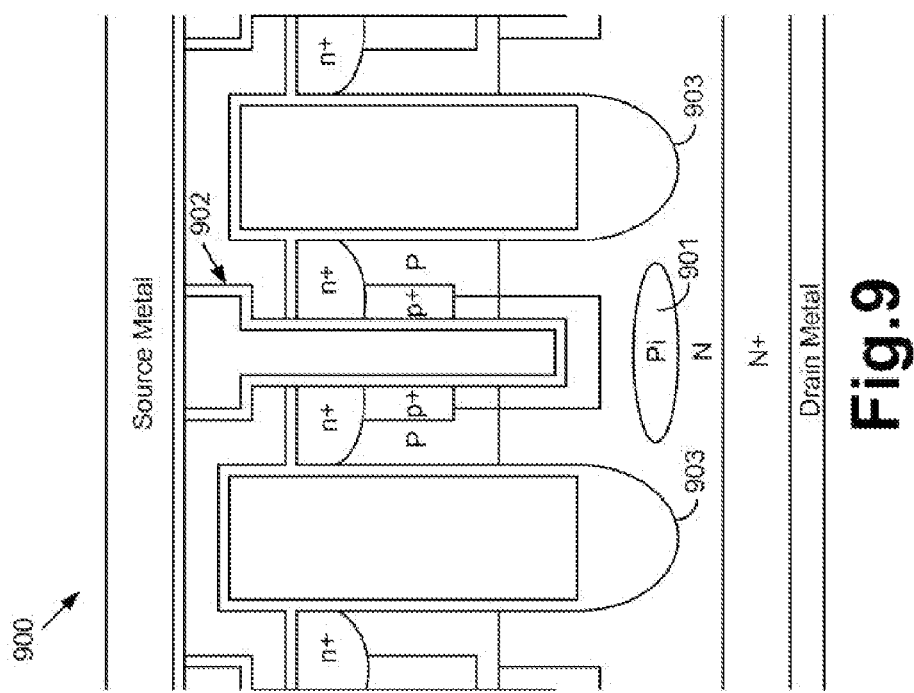
FIG. 9 is a cross-sectional view of another preferred embodiment according to the present invention.

FIG. 9 shows a cross-sectional view of another trench MOSFET 900 according to the present invention. The N-channel trench MOSFET 900 has a similar structure to the trench MOSFET 700 in FIG. 7 except that, the trench MOSFET 900 further comprises a P island (Pi, as illustrated in FIG. 8) 901 below each of the trenched source-body contacts 902 and between every two adjacent gate trenches 903 to reduce Idsx by decreasing electric field near schottky rectifier area.

Figure 10A:
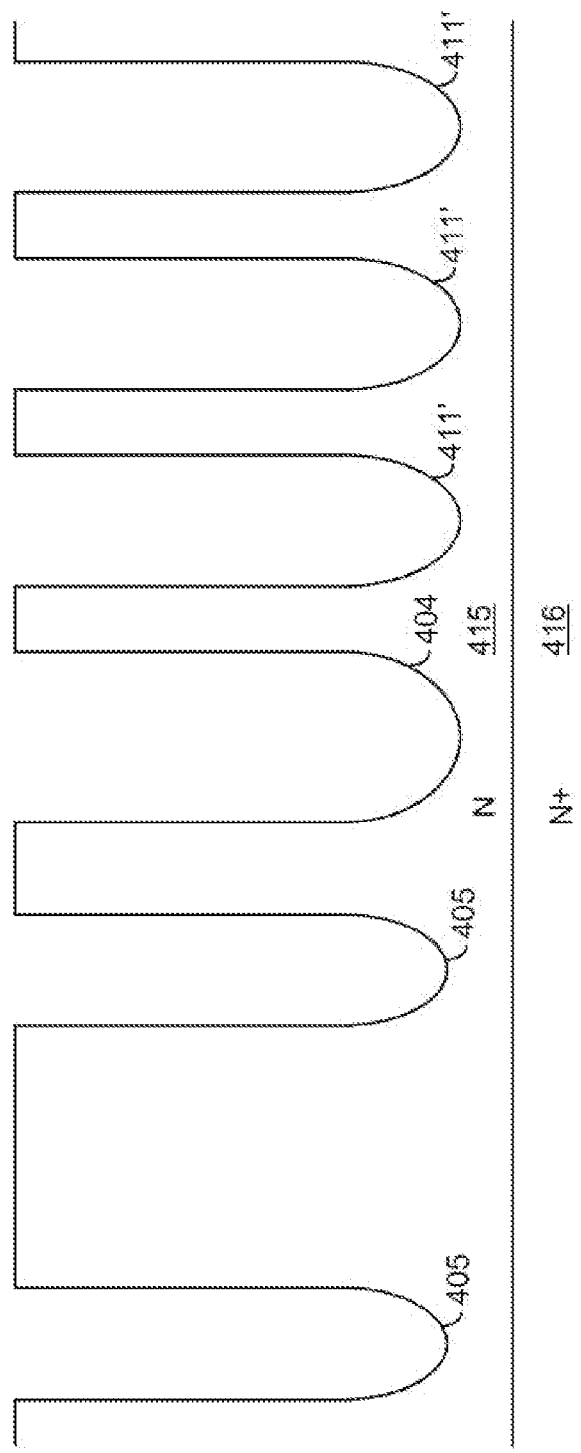

FIGS. 10A to 10H are a serial of side cross-sectional views for showing the process steps for manufacturing a trench MOSFET with embedded Schottky rectifier without requiring a body mask and a source mask, and here take the process steps for manufacturing a semiconductor power device 400 as shown in FIG. 4 for an example. Referring to FIG. 10A, an N epitaxial layer 415 is initially grown on a heavily doped N+ substrate 416. Next, a trench mask (not shown) is applied and followed by a trench etching process to define a plurality of trenches in the N epitaxial layer 415, including: a plurality of gate trenches 405 in an active area, at least one wide gate trench 404 having a greater trench width than the gate trenches 405 in a trenched gate contact area for gate connection; and multiple floating gate trenches 411 in a termination area. Then, a sacrificial oxide layer (not shown) is grown and etched to remove the plasma damaged silicon layer formed during the process of opening the gate trenches.

Figure 10B:
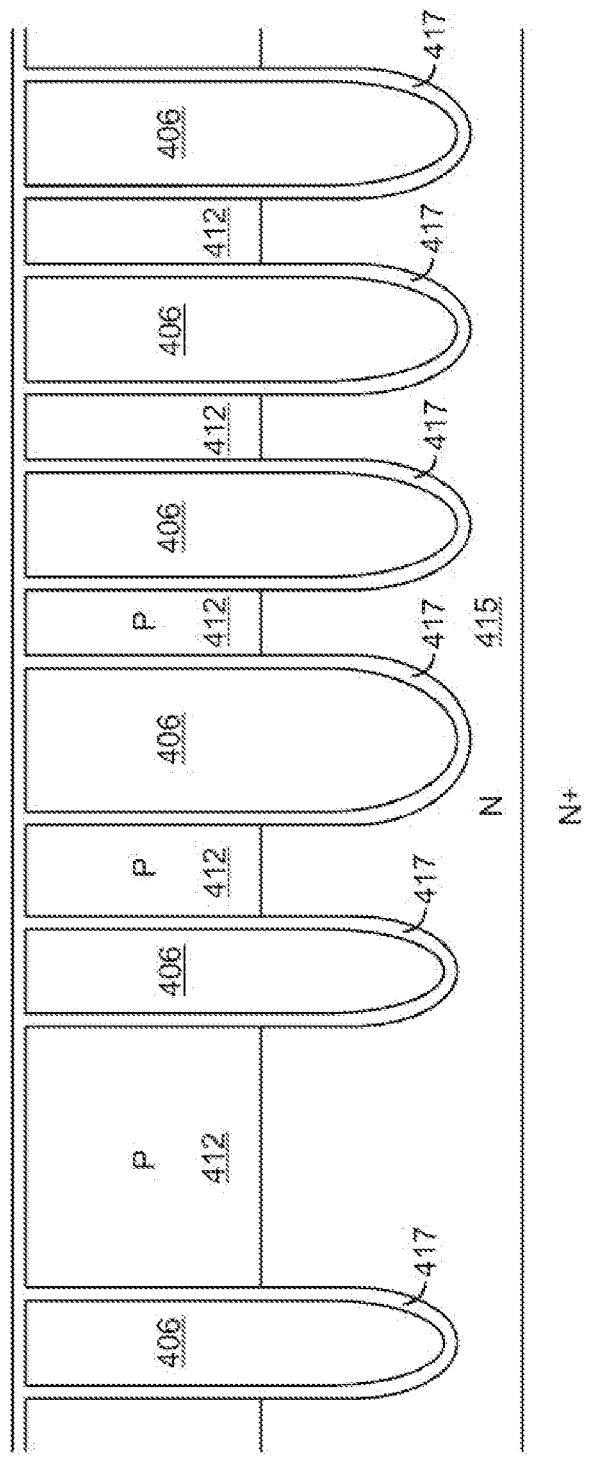

In FIG. 10B, an oxide layer is deposited or grown along an inner surface of all the gate trenches and along a top surface of the N epitaxial layer 415 to function as a gate oxide layer 417. Then, a doped poly-silicon layer is filled into all the gate trenches and followed by a poly-silicon chemical mechanical polishing (CMP, the same hereinafter) or a dry etching back process to leave the poly-silicon layer within the gate trenches to act as a conductive material 406. As an alternative, when manufacturing other preferred embodiments having terrace gate structure, the poly-silicon layer is remained having a top surface higher than the source regions. Thereafter, after carrying out a p dopant ion implantation step and a successive diffusion step, a plurality of p body regions 412 are formed in an upper portion of the N epitaxial layer 415 without requiring a body mask.

In FIG. 10C, an un-doped oxide layer 419-1 and a PSG or BPSG layer 419-2 are successively deposited on a top surface of the structure of FIG. 10B to act as a contact interlayer 419. Then, a contact mask (not shown) is employed and followed by a dry oxide etching process to define a plurality of contact openings 408' and 410' to expose a part top surface of the N epitaxial layer 415 for a followed a n dopant ion implantation step and a source diffusion step after which there form n+ source regions 420 near a top surface of the p body regions 412 in the active area of the trench MOSFET 400 without requiring a source mask.

Figure 10D:
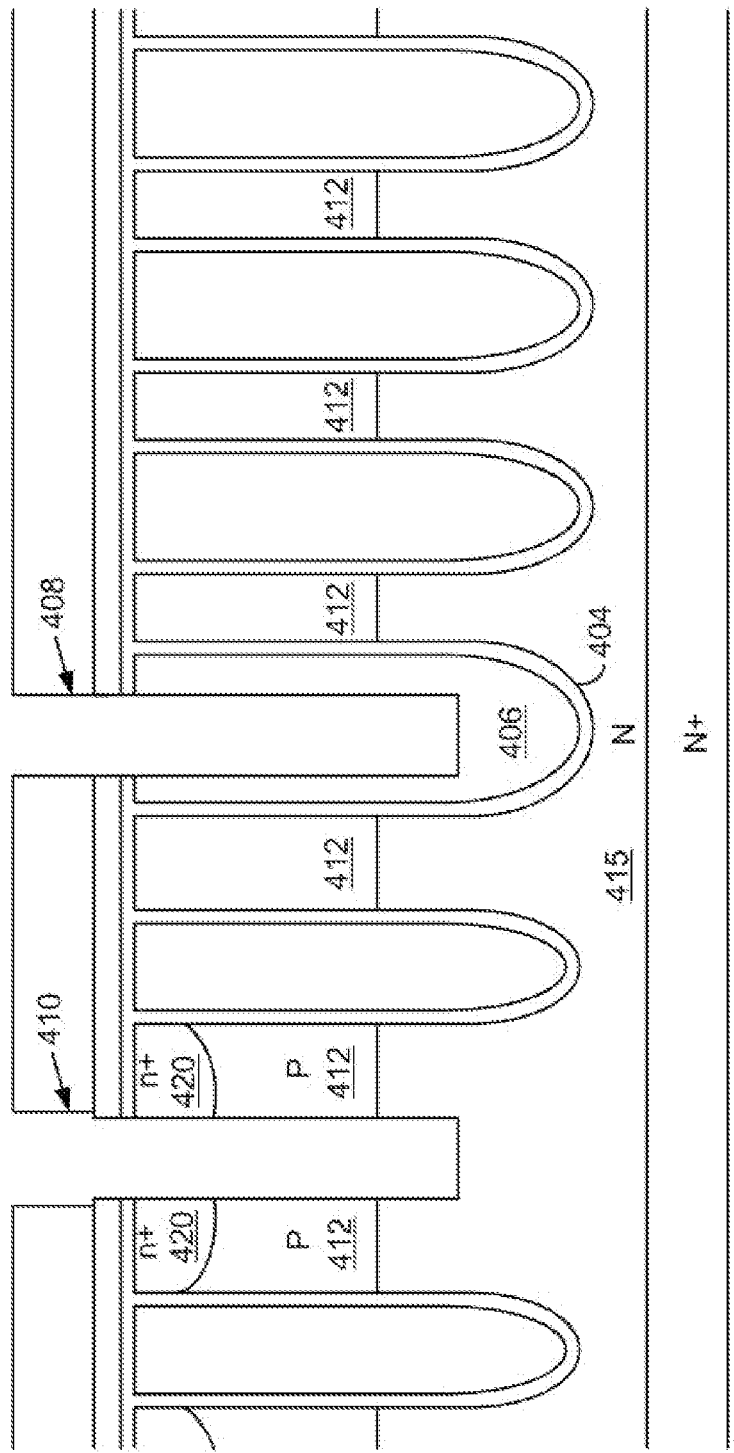

In FIG. 10D, after a dry silicon etching process, the contact openings 408' and 410' are etched to form trenched gate contact 408 and trenched source-body contact 410 respectively extending: into the conductive material 406 filled in the wide gate trench 404, and into the N epitaxial layer 415 after penetrating through the n+ source regions 420 and the p body regions 412. As an alternative, when manufacturing other preferred embodiments in which the trenched gate contact 408 has shallower depth than the trenched source-body contact 410, there requires an additional contact mask applied to define the trenched gate contact 408 and an additional etch process performed to form the trenched gate contact 408.

In FIG. 10E, a first angle ion implantation with Boron or BF2 with angle α1 respective to a vertical line (as illustrated in FIG. 10E) through the contact openings carried out to form a first anti-punch through implant region 421 along an upper portion of sidewalls of the trenched source-body contact 410 below the n+ source regions 420.

In FIG. 10F, a second angle ion implantation with Boron or BF2 with angle α2 respective to the vertical line through the contact openings is carried out to form a second anti-punch through implant region 422 below the first anti-punch through implant region 421 and surrounding bottoms and a lower portion of the sidewalls of the trenched source-body contact 410, wherein the dopant dose in the second angle ion implantation is less than the dopant dose in the first angle ion implantation, wherein angle α2 is less than angle α1 respective to the vertical line. As the second anti-punch through implant region 422 is formed by the second angle ion implantation with Boron or BF2, the part of the second anti-punch through implant region 422 located in the P body regions 412 therefore is p type and having a higher doping concentration than the P body regions 412, the other part of the second anti-punch through implant region 422 underneath the P body regions 412 therefore has either n– or p– doping type depending on the second anti-punch through implant dose.

In FIG. 10G, the PSG or BPSG layer 419-2 is etched in dilute HF to enlarge width of top surface of the contact openings to reduce contact resistance.

Figure 10H:
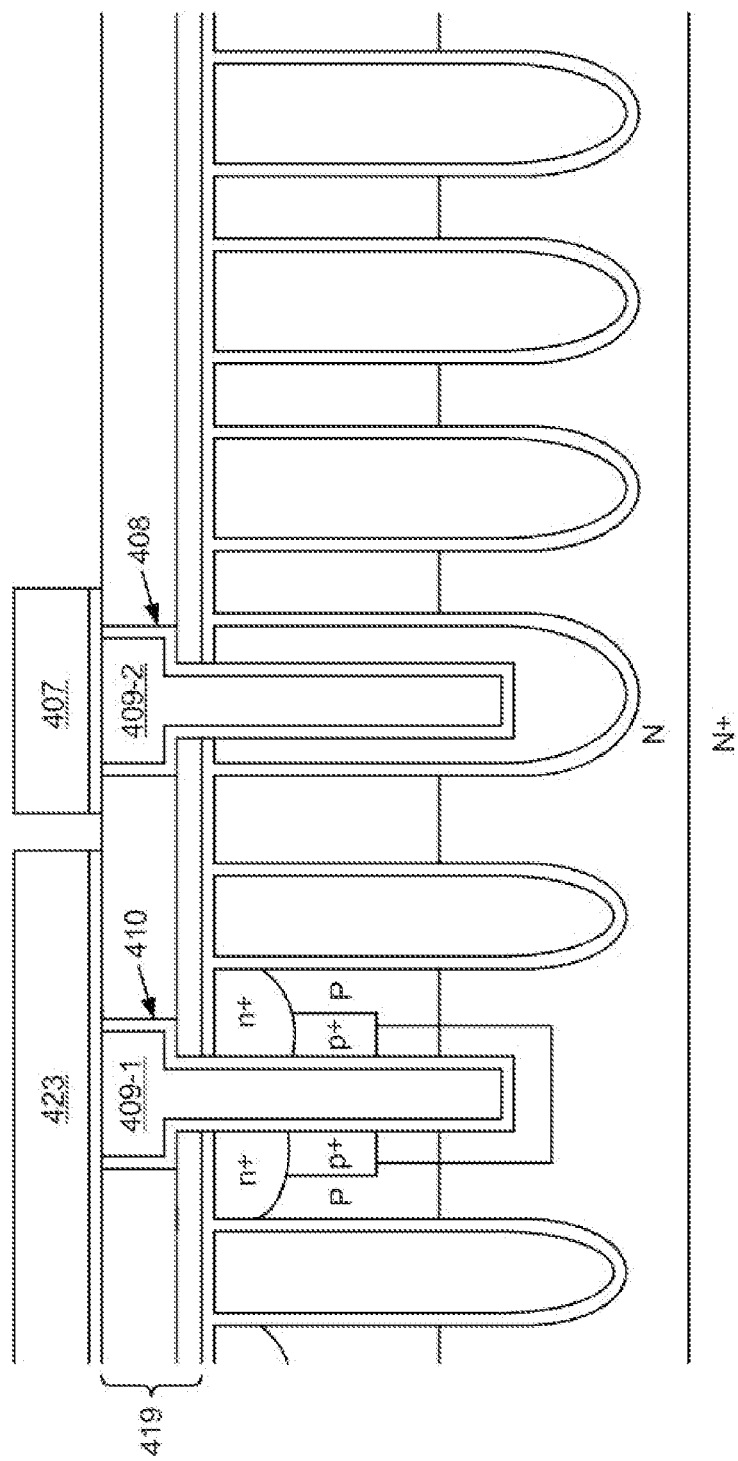

In FIG. 10H, a barrier layer Ti/TiN or Co/TiN or Ta/TiN is deposited on the sidewalls and the bottoms of all the trenched source-body contacts 410 and trenched gate contacts 408. Then, a tungsten material layer is deposited onto the barrier layer, wherein the tungsten material layer and the barrier layer are then etched back to form contact metal plugs 409-1 and 409-2 respectively for trenched source-body contacts 410 and at least one trenched gate contact 408. Then, a metal layer of Al alloys or Cu padded by a resistance-reduction layer Ti or Ti/TiN underneath is deposited onto the contact interlayer 419 and followed by a metal etching process by employing a metal mask (not shown) to form a gate metal 407 and a source metal 423. Therefore, when manufacturing the present invention shown in FIG. 4, the manufacturing process for the trench MOSFET with embedded schottky rectifier only needs three masks comprising a trench mask, a contact mask and a metal mask, which is more cost effective than the prior art.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench MOSFET with embedded schottky rectifier, comprising:

a substrate of a first conductivity type;

an epitaxial layer of said first conductivity type onto said substrate, wherein said epitaxial layer has a lower doping concentration than said substrate;

a plurality of gate trenches formed in said epitaxial layer and filled with a conductive material padded by a gate oxide layer;

a plurality of body regions of a second conductivity type formed in an upper portion of said epitaxial layer and between two adjacent said gate trenches;

a plurality of source regions of said first conductivity type formed near a top surface of said body regions and flanking said gate trenches in an active area;

a plurality of trenched source-body contacts formed in an active area, each filled with a contact metal plug, penetrating through said source regions and said body regions and extending into said epitaxial layer, wherein said trenched source-body contacts have a depth shallower than said gate trenches but deeper than said body regions; and at least one anti-punch through implant region formed along at least a portion of sidewalls of said trenched source-body contacts and below said source regions; wherein said source regions have a higher doping concentration and a greater junction depth along sidewalls of said trenched source-body contacts than along adjacent channel regions near said gate trenches at a same distance from the top surface of said epitaxial layer.

2. The trench MOSFET of claim 1, wherein said at least one anti-punch through implant region comprises a first anti-punch through implant region of said second conductivity type along an upper portion of sidewalls of said trenched source-body contacts below said source regions, wherein said first anti-punch through implant region has a higher doping concentration than said body regions.

3. The trench MOSFET of claim 1, wherein said at least one anti-punch through implant region comprises: a first anti-punch through implant region of said second conductivity type along an upper portion of sidewalls of said trenched source-body contacts below said source regions, wherein said first anti-punch through implant region has a higher doping concentration than said body regions; and a second anti-punch through implant region surrounding bottoms and a lower portion of sidewalls of said trenched source-body contacts below said first anti-punch through implant region, wherein said second anti-punch through implant region has either said first or said second conductivity doping type.

4. The trench MOSFET of claim 1, wherein said gate oxide layer has oxide thickness along bottom equal to or thinner than along sidewalls of said gate trenches.

5. The trench MOSFET of claim 1, wherein said gate oxide layer has greater thickness along bottoms than along sidewalls of said gate trenches.

6. The trench MOSFET of claim 1, wherein said conductive material in said gate trenches has a top surface not higher than said source regions.

7. The trench MOSFET of claim 1, wherein said conductive material in said gate trenches has a top surface higher than said source regions to form terrace gate structure.

8. The trench MOSFET of claim 1 further comprising at least a doped island region of said second conductivity type formed below the bottoms of said trenched source-body contacts and between every two adjacent gate trenches in said epitaxial layer for drain-source leakage current reduction.

9. The trench MOSFET of claim 1 further comprising at least one gate contact trench used for gate connection to a gate metal via a trenched gate contact, wherein said trenched gate contact has a depth substantially same as or deeper than said trenched source-body contacts.

10. The trench MOSFET of claim 1 further comprising at least one gate contact trench used for gate connection to a gate metal via a trenched gate contact, wherein said trenched gate contact has a depth shallower than said trenched source-body contacts.

11. The trench MOSFET of claim 1 further comprising a termination area including multiple trenched floating gates spaced apart from each other by said body regions, wherein said trenched floating gates have floating voltage.

* * * * *